United States Patent
Yao

(10) Patent No.: US 9,871,110 B2
(45) Date of Patent: Jan. 16, 2018

(54) SEMICONDUCTOR DEVICE

(71) Applicant: FUJI ELECTRIC CO., LTD., Kanagawa (JP)

(72) Inventor: Noriaki Yao, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/182,603

(22) Filed: Jun. 15, 2016

(65) Prior Publication Data
US 2017/0053991 A1    Feb. 23, 2017

(30) Foreign Application Priority Data
Aug. 18, 2015   (JP) ................ 2015-161021

(51) Int. Cl.
*H01L 29/41* (2006.01)
*H01L 29/739* (2006.01)
*H01L 27/115* (2017.01)
*H01L 29/417* (2006.01)
*H01L 29/04* (2006.01)

(52) U.S. Cl.
CPC ........ *H01L 29/41708* (2013.01); *H01L 29/04* (2013.01); *H01L 29/7393* (2013.01)

(58) Field of Classification Search
CPC .................................. H01L 29/7393
USPC ....................................... 257/73
See application file for complete search history.

(56) References Cited

U.S. PATENT DOCUMENTS

| | | | |
|---|---|---|---|
| 2008/0251857 A1 | 10/2008 | Brown | |
| 2009/0242977 A1* | 10/2009 | Kawaguchi | H01L 29/42368 257/330 |
| 2011/0062545 A1* | 3/2011 | Nakajima | H01L 27/0255 257/470 |
| 2012/0061766 A1 | 3/2012 | Izumi et al. | |
| 2016/0064496 A1* | 3/2016 | Siemieniec | H01L 29/407 257/331 |

FOREIGN PATENT DOCUMENTS

JP    H10-214834 A    8/1998

* cited by examiner

*Primary Examiner* — Moazzam Hossain
*Assistant Examiner* — Omar Mojaddedi

(57) ABSTRACT

It is aimed to reduce a current concentration at the edge of the contact electrode.
Provided is a semiconductor device including a semiconductor layer, a first trench electrode formed in the semiconductor layer on a front surface side thereof, and a second trench electrode formed in the semiconductor layer on the front surface side thereof so as to oppose the first trench electrode. Here, the first trench electrode is formed in a mesh-like pattern. The semiconductor layer may further include a first-conductivity-type region and a second-conductivity-type region having a different conductivity type than the first-conductivity-type region. The first trench electrode may be electrically connected to the first-conductivity-type region, and the second trench electrode may be electrically connected to the second-conductivity-type region.

10 Claims, 13 Drawing Sheets

SEMICONDUCTOR DEVICE

The contents of the following Japanese patent application are incorporated herein by reference:

NO. 2015-161021 filed on Aug. 18, 2015.

BACKGROUND

1. Technical Field

The present invention relates to a semiconductor device.

2. Related Art

Semiconductor devices have contact electrodes that are in contact with source and drain regions and other regions. In the conventional art, it is known to form such contact electrodes within trenches (see, for example, Japanese Patent Application Publication No. 2012-59945).

SUMMARY

In semiconductor devices, it is preferable to reduce current concentration at the edges of contact electrodes.

A first aspect of the innovations may include a semiconductor device including a semiconductor layer, a first trench electrode formed in the semiconductor layer on a front surface side thereof, and a second trench electrode formed in the semiconductor layer on the front surface side thereof so as to oppose the first trench electrode. Here, the first trench electrode is formed in a mesh-like pattern.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
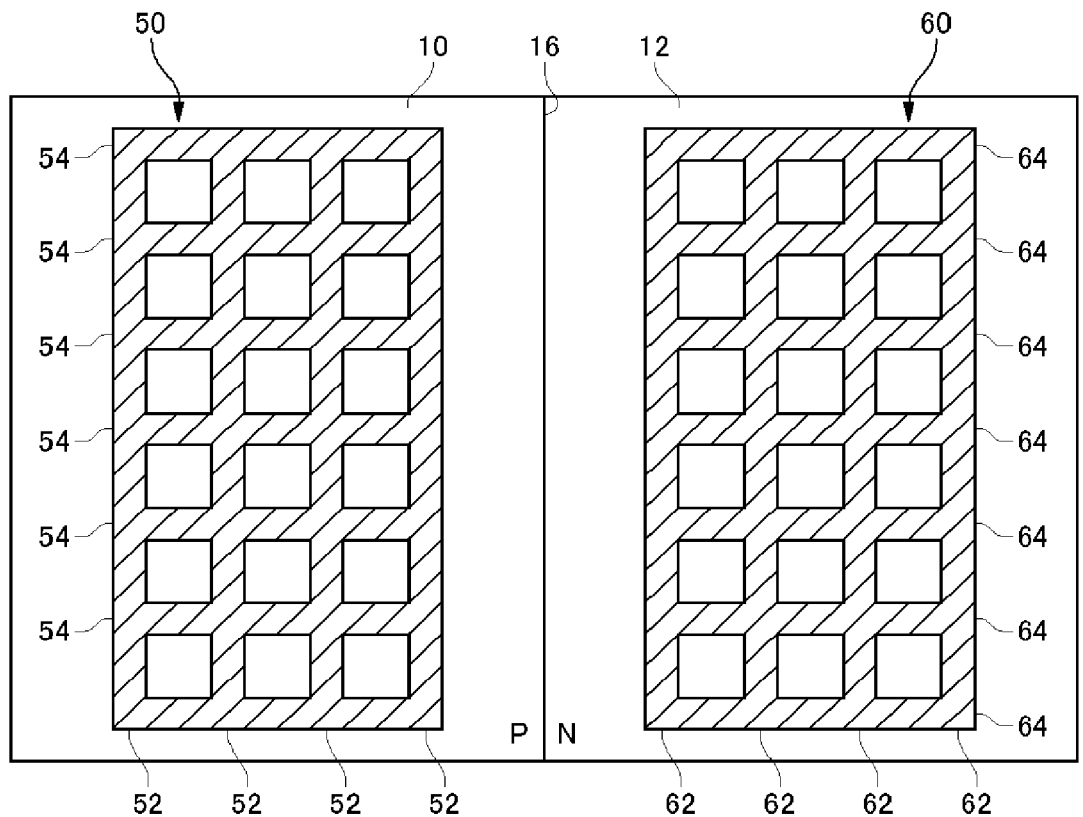
FIG. 1 is a plan view illustrating an example of a semiconductor device 100.

FIG. 1 is a plan view illustrating an example of a semiconductor device 100. The semiconductor device 100 may be a semiconductor chip including a diode and the like. FIG. 1 shows a portion of the front surface of the semiconductor device 100.

The semiconductor device 100 includes a first trench electrode 50 and a second trench electrode 60. Here, the term "trench electrode" is defined as an electrode that is made of a metal material at least a portion of which is provided in a trench that is formed in an insulative layer or the like.

In the present exemplary embodiment, the first trench electrode 50 is formed on the front surface side of a first-conductivity-type region 10. A second trench electrode 60 is formed on the front surface side of a second-conductivity-type region 12, which has a different conductivity type than the first-conductivity-type region 10, in such a manner that the first trench electrode 50 and the second trench electrode 60 oppose each other. The first-conductivity-type region 10 and the second-conductivity-type region 12 are an exemplary semiconductor layer and are made of polysilicon, for example.

In the example shown in FIG. 1, the first-conductivity-type region 10 is of the P-type and the second-conductivity-type region 12 is of the N-type. However, the conductivity types of the first-conductivity-type region 10 and the second-conductivity-type region 12 may be reversed. The first-conductivity-type region 10 and the second-conductivity-type region 12 form a p-n junction.

Here, the phrase "the first trench electrode 50 and the second trench electrode 60 oppose each other" indicates, for example, that no other electrodes are provided between the first trench electrode 50 and the second trench electrode 60 on the front surface side of the semiconductor layer. Alternatively, this phrase may indicate that currents can flow between the first trench electrode 50 and the second trench electrode 60.

The first trench electrode 50 of the present exemplary embodiment is electrically connected to the first-conductivity-type region 10. Likewise, the second trench electrode 60 is electrically connected to the second-conductivity-type region 12. In other words, the first trench electrode 50 and the second trench electrode 60 function as the cathode electrode and the anode electrode of a diode. Here, currents flow between the first trench electrode 50 and the second trench electrode 60 via the p-n junction.

Although an insulative film is formed on the front surface of the first-conductivity-type region 10 and the second-conductivity-type region 12, the insulative film is not shown in FIG. 1. At least a portion of the first trench electrode 50 and a portion of the second trench electrode 60 are provided in a trench that is formed in the insulative film.

The first trench electrode 50 is formed on the front surface side of the first-conductivity-type region 10 and has a mesh-like planar shape. Here, the expression "mesh-like" indicates that a plurality of first sections extending in a first direction intersect with a plurality of second sections extending in a second direction different than the first direction.

In the present exemplary embodiment, the first trench electrode 50 includes, on the front surface side of the semiconductor layer, two or more first parallel portions 52 that extend in parallel to a boundary surface 16 of the p-n junction formed by the first-conductivity-type region 10 and the second-conductivity-type region 12. The two or more first parallel portions 52 are provided in the trench that is formed in the insulative film on the front surface of the first-conductivity-type region 10. Here, the term "parallel" may not necessarily mean strictly parallel and may have tolerance of approximately 10 degrees.

The first parallel portions 52 are spaced away from each other. However, the first parallel portions 52 are connected to each other by means of an electrically conductive element that is formed in the same layer as the first parallel portions 52.

In other words, the first parallel portions 52 and the electrically conductive element are both provided in the trench that is formed in the same insulative film.

The first trench electrode 50 of the present exemplary embodiment further include two or more first orthogonal portions 54 that extend perpendicularly to the boundary surface 16 of the p-n junction so as to intersect with the two or more first parallel portions 52. The two or more first orthogonal portions 54 are provided within the trench that is formed in the insulative film on the front surface of the first-conductivity-type region 10. The first orthogonal portions 54 are spaced away from each other. Here, the term "perpendicular" may not necessarily mean strictly perpendicular and may have tolerance of approximately 10 degrees.

The first parallel portions 52 may be arranged at equal or non-equal intervals. Likewise, the first orthogonal portions 54 may be arranged at equal or non-equal intervals. The pitch of the first parallel portions 52 may be the same as or different from the pitch of the first orthogonal portions 54.

For example, the width of each first parallel portion 52 and the width of each first orthogonal portion 54 are approximately 0.5 μm and the intervals are approximately 1 μm for the first parallel portions 52 and the first orthogonal portions 54. The interval between two adjacent ones of the first parallel portions 52 is defined as the distance between two opposing edges.

The second trench electrode 60 may also has the same mesh-like shape as the first trench electrode 50. Specifically speaking, the second trench electrode 60 has two or more second parallel portions 62 and two or more second orthogonal portions 64. The two or more second parallel portions 62 extend in parallel to the boundary surface 16 of the p-n junction and are spaced away from each other.

The two or more second orthogonal portions 64 extend perpendicularly to the boundary surface 16 of the p-n junction so as to intersect with the two or more second parallel portions 62 and are spaced away from each other. The second parallel portions 62 and the second orthogonal portions 64 may be provided in a trench that is formed in the same insulative film, in which the first parallel portions 52 and the first orthogonal portions 54 are provided.

Figure 2:
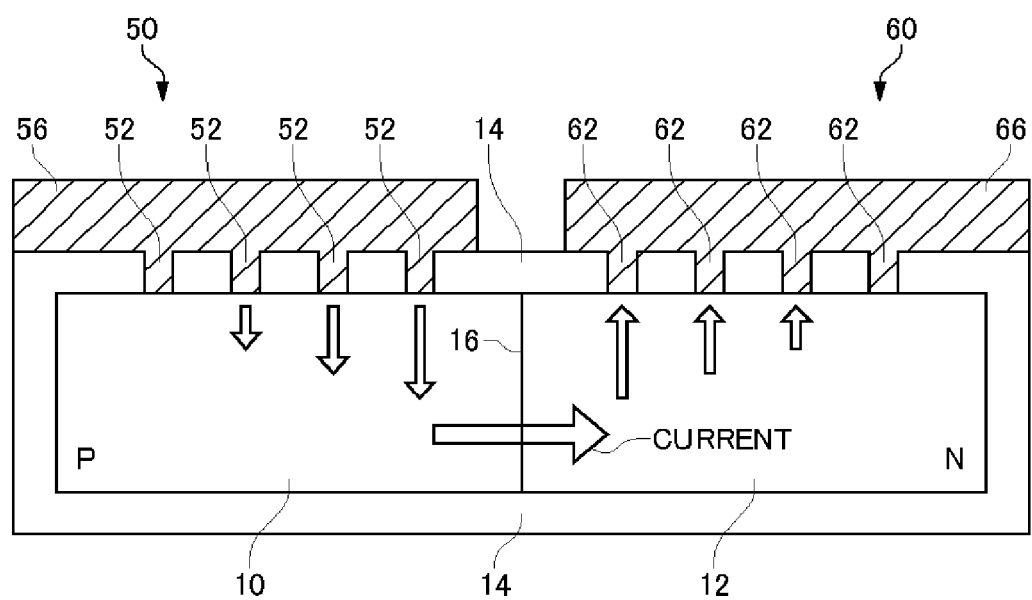
FIG. 2 shows an exemplary cross-section of the semiconductor device 100.

FIG. 2 shows an exemplary cross-section of the semiconductor device 100. FIG. 2 shows the cross-section perpendicular to the boundary surface 16 of the p-n junction.

As described above, on the front surface of the first-conductivity-type region 10 and the second-conductivity-type region 12, the insulative film 14 having the trench therein is formed. In addition, the insulative film 14 may be also formed on the side and bottom surfaces of the first-conductivity-type region 10 and the second-conductivity-type region 12. In the trench that is formed in the insulative film 14, the first parallel portions 52, the second parallel portions 62, the first orthogonal portions 54 and the second orthogonal portions 64 described with reference to FIG. 1 are formed.

The edges of the first parallel portions 52 and the first orthogonal portions 54 are in contact with the front surface of the first-conductivity-type region 10. Likewise, the edges of the second parallel portions 62 and the second orthogonal portions 64 are in contact with the front surface of the second-conductivity-type region 12. The first trench electrode 50 may further include a first connection portion 56 that is connected to the edges of the first parallel portions 52 and the first orthogonal portions 54 that face away from the first-conductivity-type region 10. The second trench electrode 60 may further include a second connection portion 66 that is connected to the edges of the second parallel portions 62 and the second orthogonal portions 64 that face away from the second-conductivity-type region 12. For example, the first connection portion 56 and the second connection portion 66 are made of a material free from tungsten, for example, aluminum or the like, and the first parallel portions 52, the first orthogonal portions 54, the second parallel portions 62 and the second orthogonal portions 64 are made of a material containing tungsten.

In the semiconductor device 100 of the present exemplary embodiment, currents flow from the P-type first trench electrode 50 to the N-type second trench electrode 60. Here, currents tend to concentrate in the portions of the respective electrodes located near the boundary surface 16 of the p-n junction. In the present exemplary embodiment, currents tend to concentrate in one of the first parallel portions 52 that is the closest to the boundary surface 16 and to one of the second parallel portions 62 that is the closest to the boundary surface 16.

In terms of the current flowing direction (in the present exemplary embodiment, the direction perpendicular to the boundary surface 16), the length of the current concentrating portion of each electrode is referred to as a propagation length Lt. A portion of each electrode having the propagation length Lt from the edge of the electrode can effectively serve as the electrode through which currents flow. The propagation length Lt increases as more currents flow but starts to saturate at a certain length. For example, the propagation length Lt starts to saturate at approximately 10 μm when a sufficiently large contact surface is formed between the electrode made of tungsten or the like and the semiconductor portion made of polysilicon or the like. When the length of the contact surface between the electrode in which the currents concentrate and the semiconductor portion is shorter than the saturation length of the propagation length Lt, the contact resistance drastically rises.

In a case where the first trench electrode 50 includes no first orthogonal portions 54, the currents concentrate in one of the first parallel portions 52 that is the closest to the boundary surface 16. When the width of each first parallel portion 52 in the direction perpendicular to the boundary surface 16 is shorter than the saturation length of the propagation length Lt of the first trench electrode 50, the contact resistance drastically rises as mentioned above.

Considering the above-described fact, the first trench electrode 50 of the present exemplary embodiment includes the first orthogonal portions 54 that connect the first parallel portions 52 to each other on the same plane as the first parallel portions 52.

For example, the first orthogonal portions 54, which connect the first parallel portions 52 to each other, may extend longer than the saturation length of the propagation length Lt from one of the first parallel portions 52 that is the closest to the boundary surface 16 in the direction away from the boundary surface 16. The existence of the first orthogonal portions 54 can introduce currents into the other first parallel portions 52 in addition to the first parallel portion 52 that is the closest to the boundary surface 16 and can thus result in distributing the concentrated currents. In this way, the contact resistance can be prevented from rising in the entire first trench electrode 50.

Here, the current flow path along the first orthogonal portions 54 can be shortened by forming the first orthogonal portions 54 generally in parallel to the current flow direction. This can lower the resistance of the current path. For the above reasons, the first orthogonal portions 54 preferably extend in the direction perpendicular to the boundary surface 16 of the p-n junction.

In the present exemplary embodiment, the width of each first parallel portion 52 in the direction perpendicular to the boundary surface 16 is shorter than the saturation length of the propagation length Lt of the first trench electrode 50. For example, the width of each first parallel portion 52 may be 1 μm or smaller, or 0.5 μm or smaller. Despite this feature, the contact resistance can be prevented from rising dues to the presence of the first orthogonal portions 54. Likewise in the second trench electrode 60, the contact resistance can be prevented from increasing by providing the second orthogonal portions 64.

The following describes an exemplary method for manufacturing the semiconductor device 100. Non-doped polysilicon is deposited on the front surface of a predetermined semiconductor substrate that is made of, for example, silicon and patterned into a predetermined shape. Following this, the polysilicon layer is entirely doped with impurities such as boron to have the P-type. Subsequently, a predetermined region of the polysilicon layer is doped with impurities such as arsenic to convert the conductivity type of the predetermined region into the N-type. In this manner, the first-conductivity-type region 10 and the second-conductivity-type region 12 can be formed.

After this, the insulative film 14 is deposited and patterned into a predetermined shape, and the trench is formed in the insulative film 14 at a predetermined position. Subsequently, a tungsten plug is formed in the trench. The formation of the tungsten plug may take plane after formation of the N-type emitter region and the P-type contact region of a semiconductor element such as an IGBT, which is to be formed using the semiconductor substrate.

Figure 3:
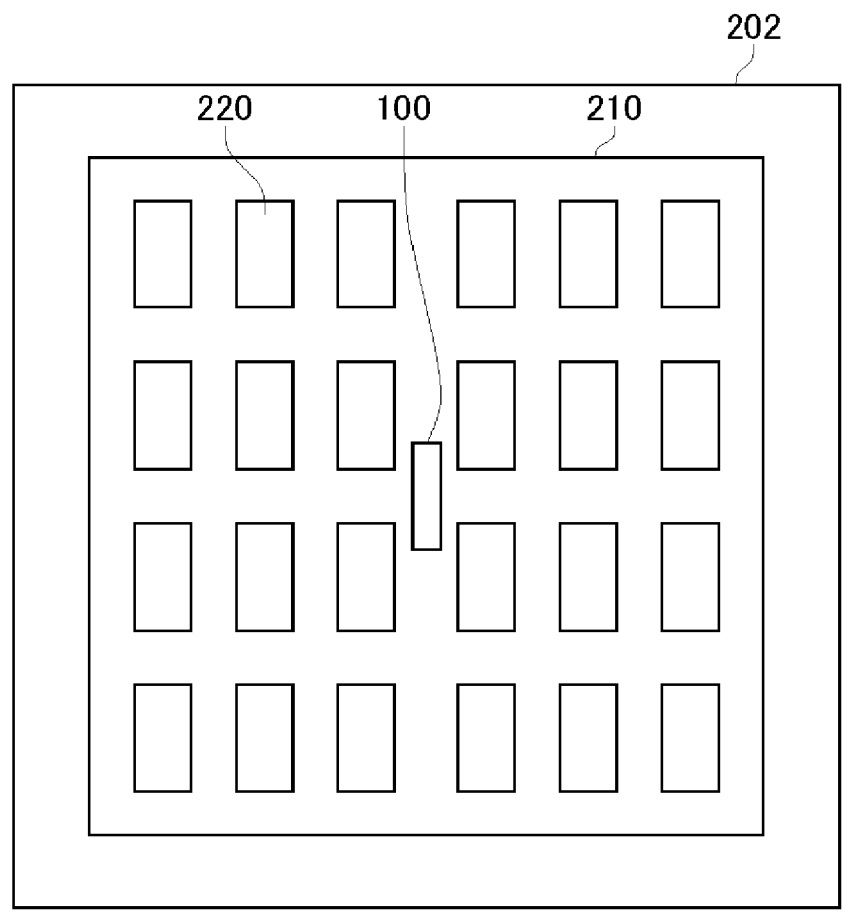
FIG. 3 is a plan view showing an example of a semiconductor device 200.

FIG. 3 is a plan view showing an example of a semiconductor device 200. The semiconductor device 200 includes a semiconductor substrate 202. The semiconductor substrate 202 has an active region 210. The active region 210 may denote the region through which currents flow when the semiconductor device 200 is operating. In the active region 210, a plurality of semiconductor elements 220 are formed. The semiconductor elements 220 include, for example, transistors such as insulated gate bipolar transistors (IGBTs), through which large currents flow. In addition, the semiconductor device 200 further includes the semiconductor device 100 described with reference to FIGS. 1 and 2. In the present exemplary embodiment, the semiconductor device 100 is a diode to serve as a temperature sensor.

Figure 4:
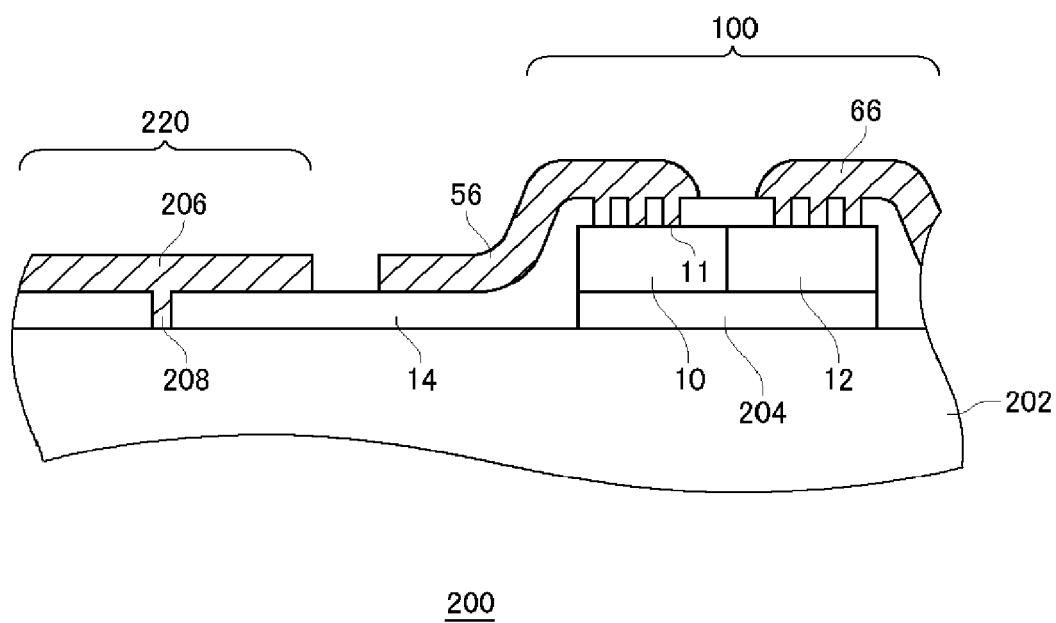
FIG. 4 shows an exemplary cross-section of the semiconductor device 200.

FIG. 4 shows an exemplary cross-section of the semiconductor device 200. FIG. 4 shows the cross-section of the semiconductor device 200 in the vicinity of the semiconductor device 100 and the semiconductor elements 220. FIG. 4 only schematically shows part of the semiconductor elements 220 and does not show the structure of the semiconductor elements 220 in detail.

The semiconductor elements 220 are formed on the front surface side of the semiconductor substrate 202. Each semiconductor element 220 includes an electrode 206 that is brought into contact with the front surface of the semiconductor substrate 202 through a contact hole 208 that is formed in the insulative film 14. The electrode 206 is bought into contact with, for example, the N-type emitter region, the P-type contact region and the like of a vertical IGBT, that are exposed on the front surface of the semiconductor substrate 202.

Between the front surface of the semiconductor substrate 202 and the first-conductivity-type region 10 and the second-conductivity-type region 12, which are made of polysilicon, an interlayer insulative film 204 is formed. Stated differently, the semiconductor device 100 is electrically insulated from the semiconductor substrate 202. In addition, a trench 11 is formed in the insulative film 14 that is formed on the front surface of the first-conductivity-type region 10 and the second-conductivity-type region 12. Within the trench 11, the respective electrodes are formed.

The contact hole 208 and the trench 11 preferably have the same width. This enables the contact hole 208 and the trench 11 to be formed in the same process. The electrode 206 within the contact hole 208 may be made of a material containing tungsten.

The feature size scaling efforts can improve the electrical characteristics of the semiconductor elements 220 such as an IGBT. For example, the feature size scaling efforts can improve the channel density. Here, it should be noted that, if the semiconductor elements 220 are made smaller, the contact hole 208 also becomes smaller.

If the width of the contact hole 208 becomes equal to or smaller than the thickness of the insulative film 14, for example, equal to or smaller than 0.6 μm, it becomes difficult to guide aluminum deep into the contact hole 208. In this case, the contact hole 208 is filled with tungsten after titanium and titanium nitride layers are stacked. In this manner, the minute contact hole 208 is filled with the electrically conductive material to the edge thereof so that a tungsten plug can be formed.

A tungsten plug is formed in the following manner. On the entire front surface of the semiconductor device 200, titanium, titanium nitride and tungsten are vapor-deposited.

After vapor-deposited, the electrically conductive materials formed on the front surface of the semiconductor device 200 is etchbacked to remove the electrically conductive materials except for them within the contact hole 208. Here, if the width of the contact hole 208 is at least no less than the thickness of the insulative film 14, to be specific, no less than 0.6 μm, or larger than 0.5 μm, the etchback process undesirably removes the electrically conductive materials within the contact hole 208. Therefore, to form a tungsten plug, the width of the contact hole 208 is preferably at least equal to or smaller than the thickness of the insulative film 14, further preferably equal to or smaller than 0.5 μm.

Here, if the trench 11 and the tungsten plug within the trench 11 are formed by the same process as the contact hole 208 and the tungsten plug within the contact hole 208, the width of the trench 11 is also preferably designed to be 0.5 μm or smaller. When the semiconductor device 100 is used for a temperature sensor or the like, the first trench electrode 50 and the second trench electrode 60 are generally formed in such a manner that a large contact area is obtained between the semiconductor layer (the first-conductivity-type region 10 and the second-conductivity-type region 12) and the first and second trench electrodes 50 and 60.

For this purpose, it may be proposed to increase the contact area between the electrodes and the semiconductor layer by forming a plurality of trenches 11 each having the same width as the contact hole 208. As described above, however, if the trench electrodes have no orthogonal portions, currents concentrate in the parallel portion of the first trench electrode 50 that is the closest to the second trench electrode 60 and the parallel portion of the second trench electrode 60 that is the closest to the first trench electrode 50. As a result, the contact resistance is elevated. To address this issue, the trench electrodes includes the orthogonal portions in the semiconductor device 100 of the present exemplary embodiment. Accordingly, the present exemplary embodiment can prevent the contact resistance from rising.

In other words, having the trench electrodes formed in a mesh-like pattern, the semiconductor device 100 of the present exemplary embodiment can distribute the current flow and thus prevent the increase in the contact resistance. The increase in contact resistance can possibly cause variability in the characteristics of the semiconductor device 100. In the above-described manner, the present exemplary embodiment can prevent such variability. For example, when used for a temperature sensor, the semiconductor device 100 can detect the temperature with higher accuracy.

Since the trench electrodes are formed in a mesh-like pattern, the electrodes can have a large contact area but be formed as trenches of a fine width. Accordingly, even if the semiconductor elements 220 are finely formed, the contact hole 208 and the trenches 11 can be formed in the same process. Since the trenches 11 are fine, the etchback process does not remove the electrically conductive materials within the trenches 11.

Figure 5:
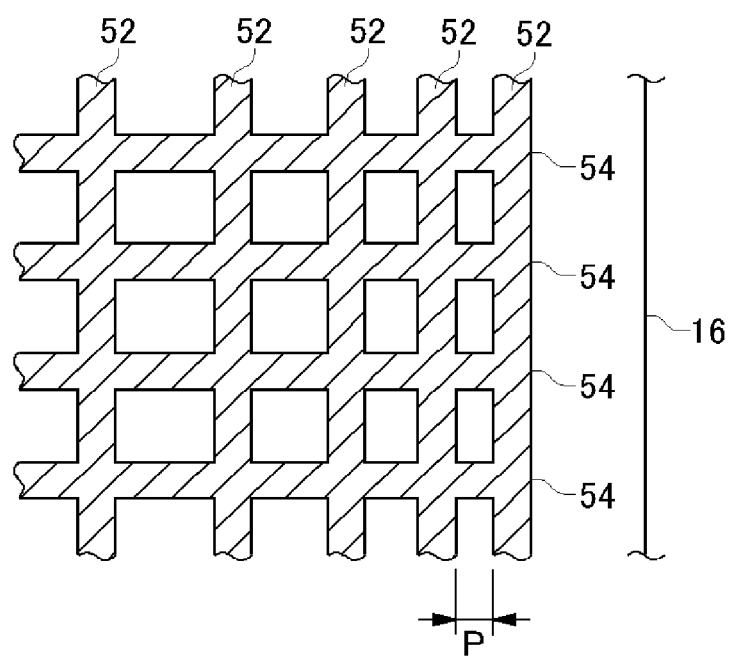
FIG. 5 shows another exemplary planar shape of a first trench electrode 50.

FIG. 5 shows another exemplary planar shape of the first trench electrode 50. In the present exemplary embodiment, the first parallel portions 52 are arranged in such a manner that the pitch P of the first parallel portions 52 decreases as the distance of the first parallel portions 52 from the boundary surface 16 of the p-n junction decreases. Stated differently, the first parallel portions 52 are more densely arranged in the region close to the boundary surface 16 than in the region distant from the boundary surface 16. Such an arrangement can raise the density of the first parallel portions 52 in the region in which the currents tend to concentrate. As a result, the currents can be efficiently distributed. On the other hand, the first orthogonal portions 54 may be arranged at equal intervals.

FIG. 5 only shows the first trench electrode 50 but the second trench electrode 60 may also have the same shape. To be specific, the second parallel portions 62 may be arranged in such a manner that the interval between adjacent ones of the second parallel portions 62 decreases as the distance of the second parallel portions 62 from the boundary surface 16 of the p-n junction decreases. The second orthogonal portions 64 may be arranged at equal intervals. The arrangement shown in FIG. 5 may be applied to any of the semiconductor devices 100 shown in FIGS. 1 to 4.

Figure 6:
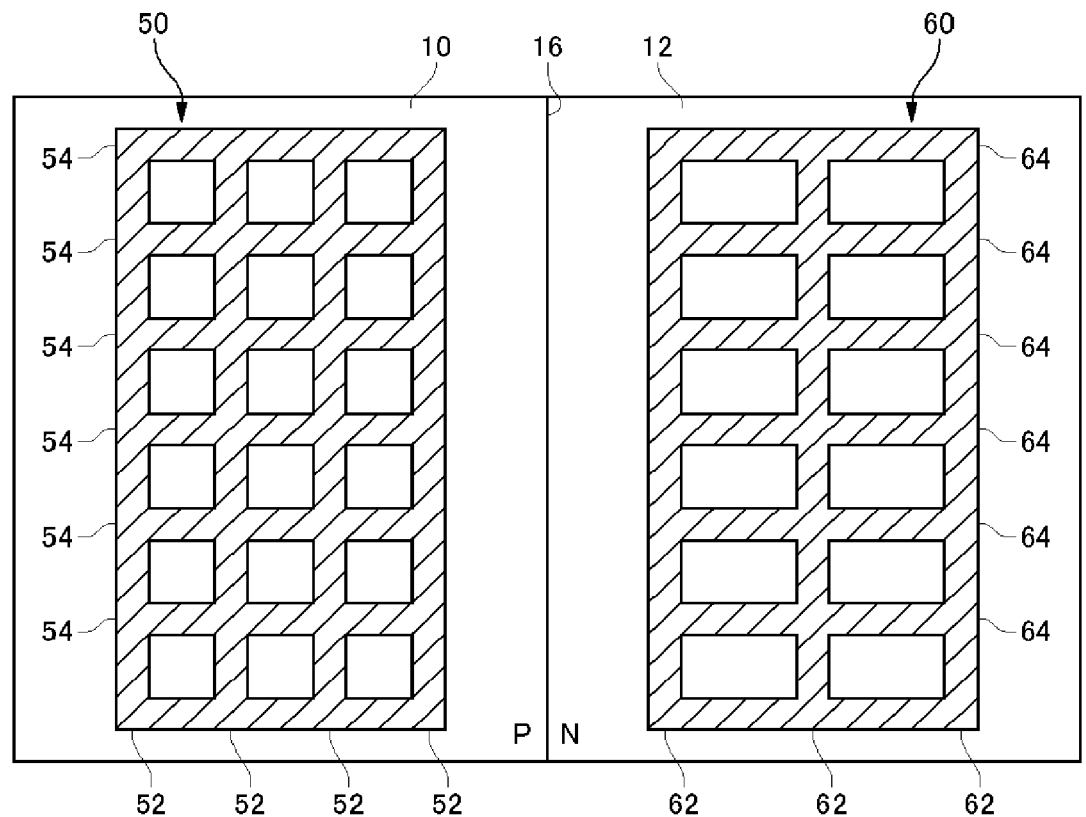
FIG. 6 shows other exemplary planar shapes of the first trench electrode 50 and a second trench electrode 60.

FIG. 6 shows other exemplary planar shapes of the first trench electrode 50 and the second trench electrode 60. In the present exemplary embodiment, the intervals of the first parallel portions 52 in the first trench electrode 50 is smaller than the intervals of the second parallel portions 62 in the second trench electrode 60. Note that the first parallel portions 52 are arranged at regular intervals. The second parallel portions 62 are also arranged at regular intervals. The intervals of the first orthogonal portions 54 may be the same as the intervals of the second orthogonal portions 64.

Generally speaking, the P-type polysilicon layer exhibits a higher contact resistance against the electrode materials such as titanium than the N-type polysilicon layer. With the electrode arrangement of the present exemplary embodiment, the electrodes can be arranged at a high density in the first trench electrode 50, which is in contact with the P-type polysilicon layer. Accordingly, the contact resistance between the first trench electrode 50 and the first-conductivity-type region 10 can be effectively lowered.

The arrangement shown in FIG. 6 may be applied to any of the semiconductor devices 100 shown in FIGS. 1 to 4.

Figure 7:
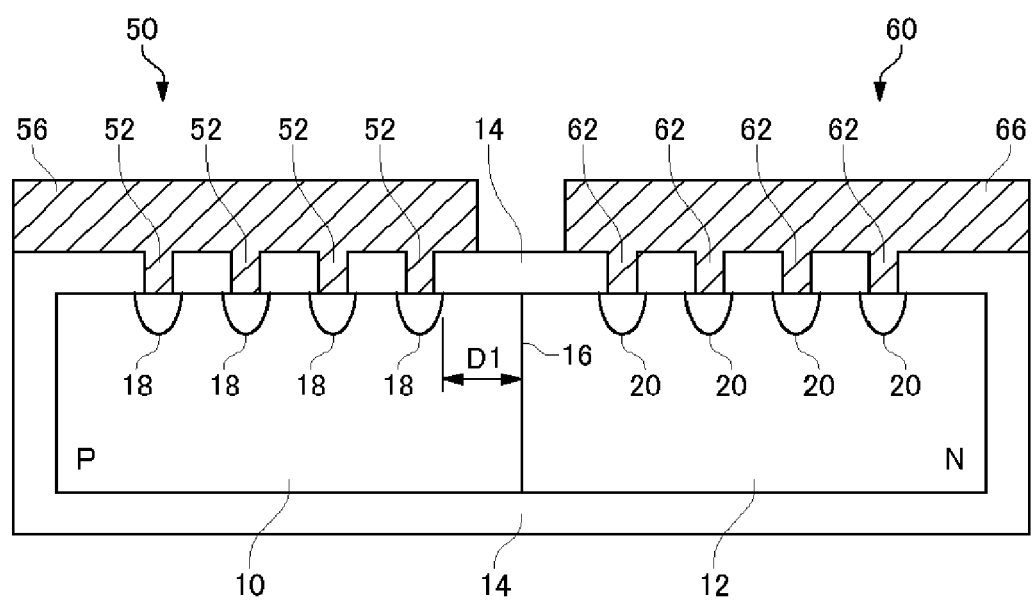
FIG. 7 shows another exemplary cross-section of the semiconductor device 100.

FIG. 7 shows another exemplary cross-section of the semiconductor device 100. The semiconductor device 100 of the present exemplary embodiment includes one or more P-type high concentration regions 18 and one or more N-type high concentration regions 20, in addition to the components of the semiconductor device 100 shown in FIG. 2. The P-type high concentration regions 18 are formed in the first-conductivity-type region 10 on the front surface side thereof and in contact with the first trench electrode 50. The P-type high concentration regions 18 have a higher impurity concentration than the other portions of the first-conductivity-type region 10. This feature can lower the contact resistance between the first trench electrode 50 and the first-conductivity-type region 10.

The P-type high concentration regions 18 are formed in contact with the bottom of at least one of the first parallel portions 52. The P-type high concentration regions 18 may be formed in contact with the bottom of one of the first parallel portions 52 that is the closest to the boundary surface 16 of the p-n junction. No P-type high concentration region 18 may be provided for the bottom of one of the first parallel portions 52 that is the most distant from the boundary surface 16 of the p-n junction. The P-type high concentration regions 18 may or may not be provided for the bottoms of the first orthogonal portions 54.

The N-type high concentration regions 20 are formed in the second-conductivity-type region 12 on the front surface side thereof and in contact with the second trench electrode 60. The N-type high concentration regions 20 have a higher impurity concentration than the other portions of the second-conductivity-type region 12. This feature can lower the contact resistance between the second trench electrode 60 and the second-conductivity-type region 12.

The N-type high concentration regions 20 are formed in contact with the bottom of at least one of the second parallel portions 62. The N-type high concentration regions 20 may be formed in contact with the bottom of one of the second parallel portions 62 that is the closest to the boundary surface 16 of the p-n junction. No N-type high concentration region 20 may be provided for the bottom of one of the second parallel portions 62 that is the most distant from the boundary surface 16 of the p-n junction. The N-type high concentration regions 20 may or may not be provided for the bottoms of the second orthogonal portions 64.

The distance D1 between the boundary surface 16 and one of the P-type high concentration regions 18 that is the closest to the boundary surface 16 of the p-n junction is preferably 0.5 μm or longer. This can prevent the connection between the P-type high concentration region 18 and the boundary surface 16 of the p-n junction. The distance D1 may be 1 μm or longer. Likewise, the distance between the boundary surface 16 and one of the N-type high concentration regions 20 that is the closest to the boundary surface 16 of the p-n junction may be 0.5 μm or longer, or 1 μm or longer.

While the first-conductivity-type region 10 includes the P-type high concentration regions 18, the second-conductivity-type region 12 may not include the N-type high concentration regions 20. By providing the P-type high concentration regions 18 in the P-type first-conductivity-type region 10, which has a relatively high contact resistance against the electrode, the contact resistance can be efficiently lowered. The structure shown in FIG. 7 may be applied to any of the semiconductor devices 100 shown in FIGS. 1 to 6.

Figure 8A:
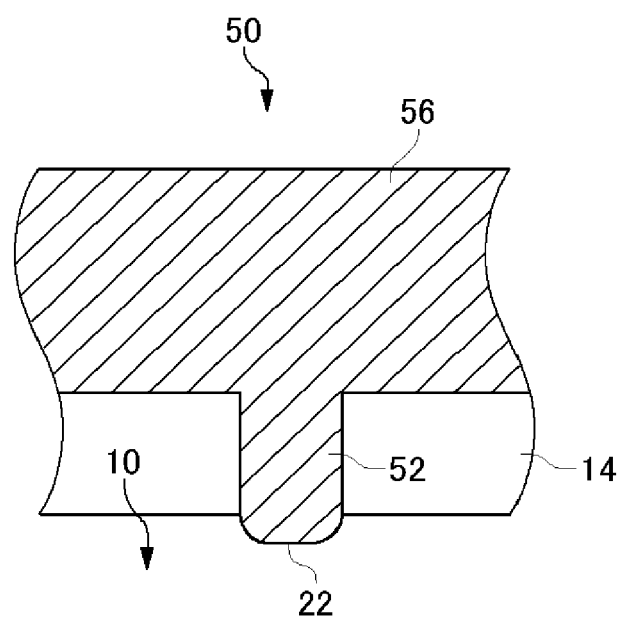
FIG. 8A shows an exemplary cross-sectional shape of a first parallel portion 52.

FIG. 8A shows an exemplary cross-sectional shape of each first parallel portion 52. A depression 22 is provided on the surface of the polysilicon first-conductivity-type region 10 that is in contact with the first parallel portion 52, but not provided on the surface that is not in contact with the first parallel portion 52. The first parallel portion 52 also fills the depression 22.

Figure 8B:
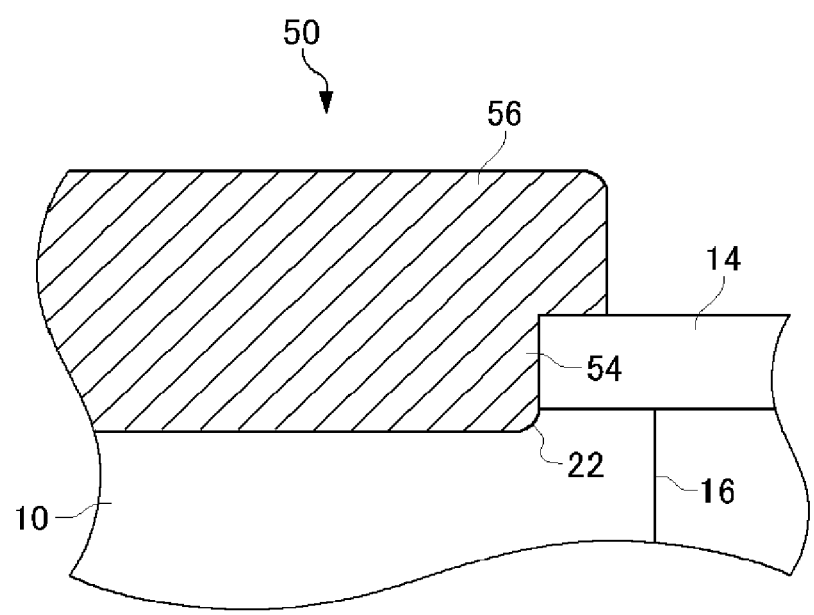
FIG. 8B shows an exemplary cross-sectional shape of a first orthogonal portion 54.

FIG. 8B shows an exemplary cross-sectional shape of each first orthogonal portion 54. FIG. 8B shows the cross-section along the direction in which the first orthogonal portion 54 extends (the direction perpendicular to the boundary surface 16). A depression 22 is provided on the surface of the polysilicon first-conductivity-type region 10 that is in contact with the first orthogonal portion 54, but not provided on the surface that is not in contact with the first orthogonal portion 54. The first orthogonal portion 54 also fills the depression 22.

The above-described feature can reduce the contact resistance between the first trench electrode 50 and the first-conductivity-type region 10. The features shown in FIGS. 8A and 8B may be applied to any of the semiconductor devices 100 shown in FIGS. 1 to 7. The second trench electrode 60 and the second-conductivity-type region 12 may also have the same features.

Figure 9:
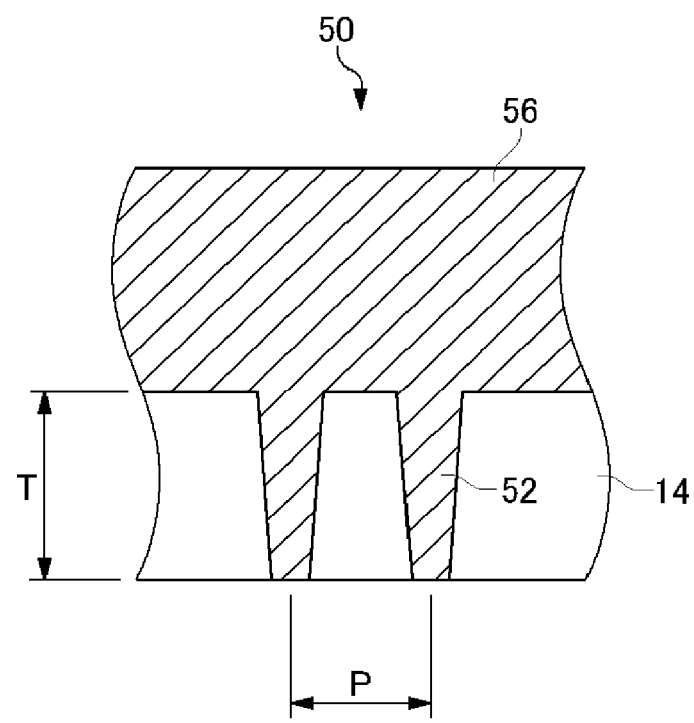
FIG. 9 shows an exemplary arrangement of two or more first parallel portions 52.

FIG. 9 shows an exemplary arrangement of two or more first parallel portions 52. The two or more first parallel portions 52 are provided in the trench that is formed in the insulative film 14. For this reason, the insulative film 14 is positioned between the two or more first parallel portions 52.

In the present exemplary embodiment, the pitch P of the two or more first parallel portions 52 in the direction perpendicular to the boundary surface 16 of the p-n junction is smaller than the thickness T of the insulative film 14 that is provided between the two or more first parallel portions 52. The pitch P may be defined as the interval between the centers of the two adjacent ones of the first parallel portions 52. When the two or more first parallel portions 52 are arranged at unequal intervals, the pitch P may be defined as the smallest interval between the two or more first parallel portions 52. The pitch P may be 0.6 times or more as large as the thickness T. For example, while the thickness T of the insulative film 14 is approximately 0.6 µm, the pitch P may be approximately 0.5 µm. The feature shown in FIG. 9 may be applied to any of the semiconductor devices 100 shown in FIGS. 1 to 8B.

Figure 10:
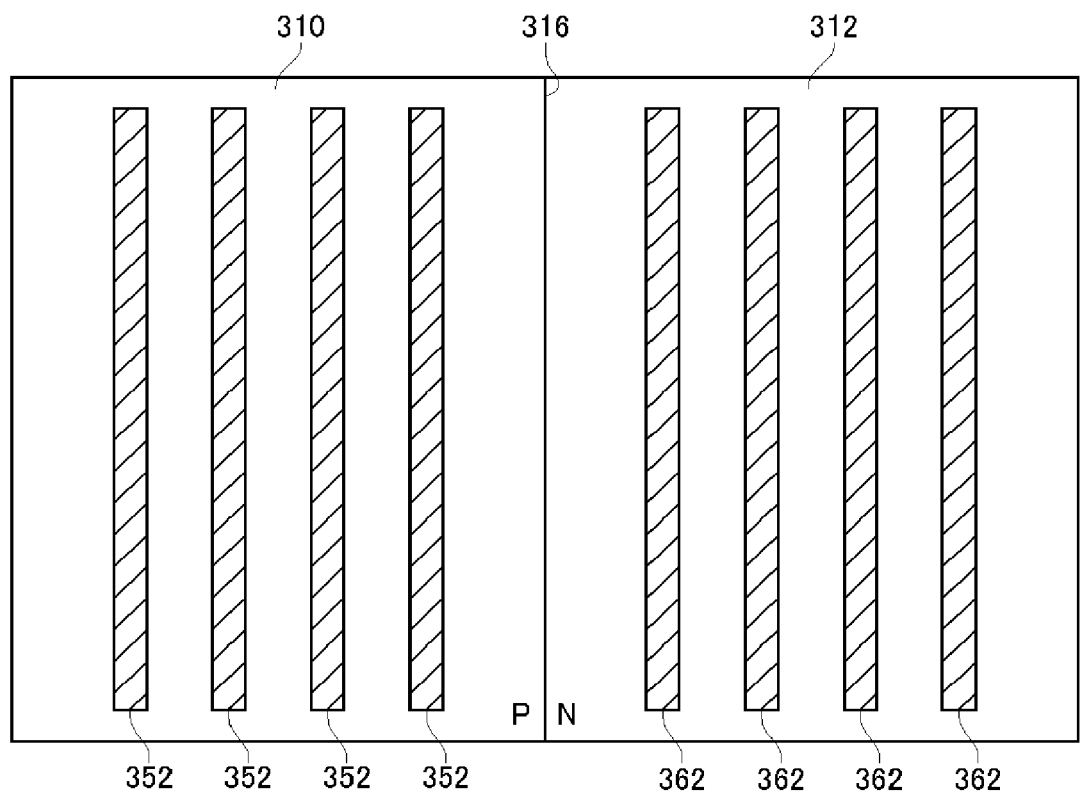
FIG. 10 is a plan view showing a semiconductor device 300 relating to a comparative example.
Figure 11:
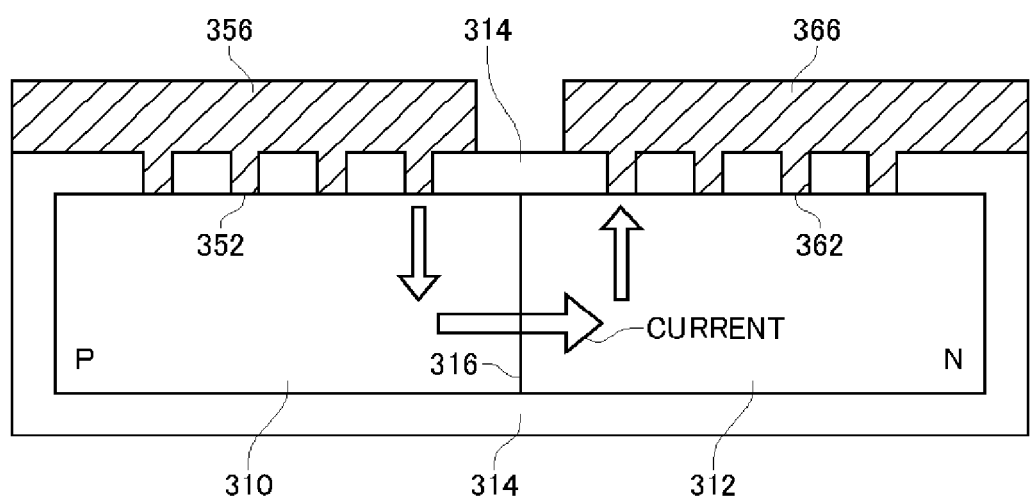
FIG. 11 shows the cross-section of the semiconductor device 300.

FIG. 10 is a plan view showing a semiconductor device 300 relating to a comparative example. FIG. 11 shows the cross-section of the semiconductor device 300. The semiconductor device 300 has a first-conductivity-type region 310 and a second-conductivity-type region 312. The first-conductivity-type region 310 and the second-conductivity-type region 312 form a p-n junction.

An insulative film 314 is formed on the front surface of the first-conductivity-type region 310 and the second-conductivity-type region 312. The insulative film 314 has a plurality of trenches formed therein, and first trench electrodes 352 and second trench electrodes 362 are formed in the trenches. The first trench electrodes 352 are in contact with the first-conductivity-type region 310 and extend in the direction parallel to the boundary surface 316 of the p-n junction. The second trench electrodes 362 are in contact with the second-conductivity-type region 312 and extend in the direction parallel to the boundary surface 316 of the p-n junction. The upper surfaces of the first trench electrodes 352 are electrically connected to each other through a first connection portion 356, and the upper surfaces of the second trench electrodes 362 are electrically connected to each other through a second connection portion 366.

The semiconductor device 300 has no orthogonal portions that connect the first trench electrodes 352 to each other and connect the second trench electrodes 362 to each other in the same plane as the first trench electrodes 352 and the second trench electrodes 362. For this reason, currents concentrate in one of the first trench electrodes 352 that is the closest to the boundary surface 16 of the p-n junction and to one of the second trench electrodes 362 that is the closest to the boundary surface 16 of the p-n junction. If the width of each first trench electrode 352 and the width of each second trench electrode 362 are smaller than the saturation length of the propagation length Lt, the trench electrode width limits the current flowing area before the saturation of the propagation length Lt does. Accordingly, the contact resistance drastically rises.

To address this issue, the semiconductor device 100 has the orthogonal portions in the trench electrodes. This can distribute the current flow into the plurality of parallel portions. As a result, the elevation of the contact resistance can be prevented.

Figure 12:
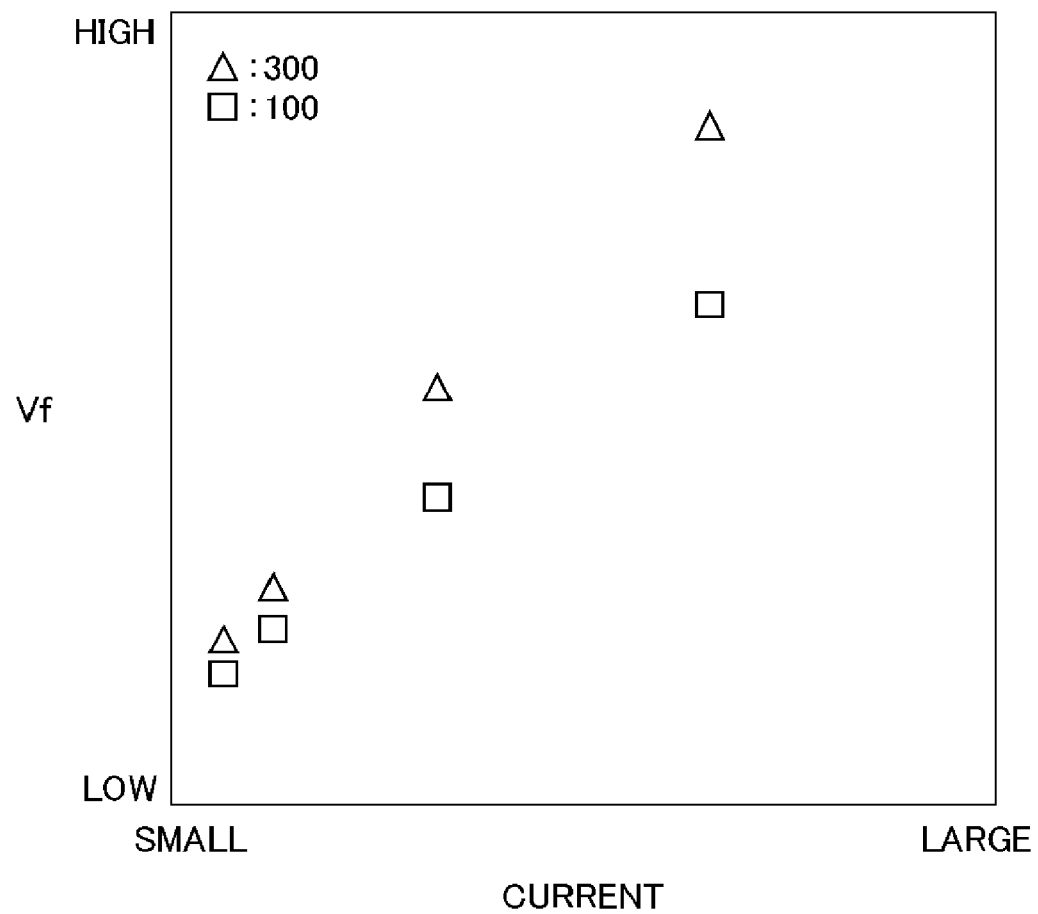
FIG. 12 shows the relation between the forward voltage Vf and the current for the semiconductor device 100 and the semiconductor device 300.

FIG. 12 shows the relation between the forward voltage Vf and the current for the semiconductor device 100 and the semiconductor device 300. When compared with the semiconductor device 300, the semiconductor device 100 can achieve larger currents with lower forward voltage Vf. This is probably attributable to the small contact resistance between the trench electrodes and the semiconductor layers in the semiconductor device 100.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

When used in the claims or specification, the terms "upper" and "upward" indicate the opposite direction to the terms "lower" and "downward." It, however, should be noted that the terms "upper" and "upward" do not necessarily mean the direction opposite to the direction of the gravitational force. Likewise, the terms "lower" and "downward" do not necessarily mean the direction of the gravitational force. For example, the present invention clearly covers a semiconductor device, mounted on an electric device, in which the gate electrode or the like is arranged on the surface of the semiconductor substrate that faces the ground surface.

DESCRIPTION OF REFERENCE NUMERALS

10 . . . first-conductivity-type region, 11 . . . trench, 12 . . . second-conductivity-type region, 14 . . . insulative film, 16 . . . boundary surface, 18 . . . P-type high concentration region, 20 . . . N-type high concentration region, 22 . . . depression, 50 . . . first trench electrode, 52 . . . first parallel portion, 54 . . . first orthogonal portion, 56 . . . first connection portion, 60 . . . second trench electrode, 62 . . . second parallel portion, 64 . . . second orthogonal portion, 66 . . . second connection portion, 100 . . . semiconductor device, 200 . . . semiconductor device, 202 . . . semiconductor substrate, 204 . . . interlayer insulative film, 206 . . . electrode, 208 . . . contact hole, 210 . . . active region, 220 . . . semiconductor element, 300 . . . semiconductor device, 310 . . . first-conductivity-type region, 312 . . . second-conductivity-type region, 314 . . . insulative film, 316 . . . boundary surface, 352 . . . first trench electrode, 356 . . . first connection portion, 362 . . . second trench electrode, 366 . . . second connection portion

The invention claimed is:

1. A semiconductor device comprising:
a semiconductor layer including a first-conductivity-type region and a second-conductivity-type region having a different conductivity type than the first-conductivity-type region;
a first trench electrode formed in the semiconductor layer on a front surface side thereof and electrically connected to the first-conductivity-type region; and
a second trench electrode formed in the semiconductor layer on the front surface side thereof and electrically connected to the second-conductivity-type region, the second trench electrode opposing the first trench electrode, wherein
the first trench electrode is formed in a mesh-like pattern,
the first-conductivity-type region and the second-conductivity-type region form a p-n junction,
the first trench electrode includes two or more first parallel portions that extend in parallel to a boundary surface of the p-n junction and that are spaced away from each other, and
a pitch of the first parallel portions decreases as a distance of the first parallel portions from the boundary surface of the p-n junction decreases.

2. The semiconductor device of claim 1, further comprising
an insulative film formed between the first parallel portions, wherein
a pitch of the two or more first parallel portions in a direction perpendicular to the boundary surface of the p-n junction is smaller than a thickness of the insulative film.

3. The semiconductor device of claim 1, wherein
the first trench electrode further includes two or more first orthogonal portions that extend perpendicularly to the boundary surface of the p-n junction to intersect with the two or more first parallel portions and that are spaced away from each other.

4. The semiconductor device of claim 3, wherein
the second trench electrode includes:
two or more second parallel portions that extend in parallel to the boundary surface of the p-n junction and that are spaced away from each other; and
two or more second orthogonal portions that extend perpendicularly to the boundary surface of the p-n junction so as to intersect with the two or more second parallel portions and that are spaced away from each other.

5. The semiconductor device of claim 4, wherein
a pitch of the two or more first parallel portions is smaller than a pitch of the two or more second parallel portions.

6. The semiconductor device of claim 1, wherein
the semiconductor layer is a polysilicon layer.

7. The semiconductor device of claim 6, further comprising:
a semiconductor substrate having the polysilicon layer formed on a front surface thereof; and
an interlayer insulative film formed between the front surface of the semiconductor substrate and the polysilicon layer.

8. The semiconductor device of claim 6, wherein
a depression is provided in a surface of the polysilicon layer that is in contact with the first trench electrode, not in a surface of the polysilicon layer that is not in contact with the first trench electrode.

9. The semiconductor device of claim 1, wherein
the first trench electrode contains tungsten.

10. A semiconductor device comprising:
a semiconductor layer including a first-conductivity-type region and a second-conductivity-type region having a different conductivity type than the first-conductivity-type region;
a first trench electrode formed in the semiconductor layer on a front surface side thereof and electrically connected to the first-conductivity-type region; and
a second trench electrode formed in the semiconductor layer on the front surface side thereof and electrically connected to the second-conductivity-type region, the second trench electrode opposing the first trench electrode, wherein
the first trench electrode is formed in a mesh-like pattern,
the first-conductivity-type region and the second-conductivity-type region form a p-n junction,
the first trench electrode includes two or more first parallel portions that extend in parallel to a boundary surface of the p-n junction and that are spaced away from each other, and
a width of each first parallel portion in a direction perpendicular to the boundary surface of the p-n junction is smaller than a saturation length of a propagation length of the first trench electrode.

* * * * *